United States Patent
Crompvoets et al.

(10) Patent No.: US 12,317,656 B2
(45) Date of Patent: May 27, 2025

(54) LIGHT EMITTING DEVICE

(71) Applicant: LUMILEDS, LLC, San Jose, CA (US)

(72) Inventors: Floris Maria Hermansz Crompvoets, Bunde (NL); Christian Kleijnen, Ell (DE); Georg Henninger, Aachen (DE); Danijel Labas, Baesweiler (DE); Gerhard Hebbinghaus, Juelich (DE)

(73) Assignee: LUMILEDS, LLC, San Jose, CA (US)

( * ) Notice: Subject to any disclaimer, the term of this patent is extended or adjusted under 35 U.S.C. 154(b) by 218 days.

(21) Appl. No.: 17/460,935

(22) Filed: Aug. 30, 2021

(65) Prior Publication Data

US 2021/0391512 A1 Dec. 16, 2021

Related U.S. Application Data

(63) Continuation of application No. 16/276,980, filed on Feb. 15, 2019, now Pat. No. 11,107,959.

(30) Foreign Application Priority Data

Jul. 18, 2018 (EP) .................... 18184173

(51) Int. Cl.
*H10H 20/854* (2025.01)
*H10H 20/01* (2025.01)
(Continued)

(52) U.S. Cl.
CPC ...... *H10H 20/854* (2025.01); *H10H 20/8506* (2025.01); *H10H 20/856* (2025.01); *H10H 20/857* (2025.01); *H10H 20/8581* (2025.01); *H10H 20/0362* (2025.01); *H10H 20/855* (2025.01)

(58) Field of Classification Search
CPC .............................. H01L 33/48–648
See application file for complete search history.

(56) References Cited

U.S. PATENT DOCUMENTS

| 5,371,124 | A | 12/1994 | Cooke |
| 6,770,498 | B2 | 8/2004 | Hsu |

(Continued)

FOREIGN PATENT DOCUMENTS

| EP | 1914809 | 4/2008 |
| JP | 2017-152475 | 8/2017 |

(Continued)

*Primary Examiner* — Mounir S Amer
(74) *Attorney, Agent, or Firm* — VOLPE KOENIG

(57) ABSTRACT

The invention relates to a light emitting device (LED), especially a LED at least partly embedded in transparent or translucent silicone fill, whereby the embedded LED is housed in a white silicone housing. Here and in the following, the wording transparent silicone fill always means a transparent or translucent silicone material. The invention further relates to a method for embedding the LED partly in a white silicone housing on the one hand and partly in transparent silicone fill on the other hand. The invention finally relates to the transparent silicone fill. The inner part of the LED device is at least partly embedded in transparent silicone fill, wherein the at least partly embedded LED device is housed in a white silicone housing comprising a white box silicone. A part of the inner part of the LED device is embedded in the white box silicone.

6 Claims, 11 Drawing Sheets

(51) Int. Cl.
*H10H 20/85* (2025.01)
*H10H 20/855* (2025.01)
*H10H 20/856* (2025.01)
*H10H 20/857* (2025.01)
*H10H 20/858* (2025.01)

(56) References Cited

U.S. PATENT DOCUMENTS

| | | | |
|---|---|---|---|
| 8,896,199 | B2 | 11/2014 | Ito et al. |
| 10,090,444 | B2 | 10/2018 | Basin et al. |
| 10,204,887 | B2 | 2/2019 | Rong et al. |
| 10,396,257 | B2 | 8/2019 | Sajiki |
| 10,461,065 | B2 | 10/2019 | Ozeki et al. |
| 10,593,844 | B2 | 3/2020 | Hayashi et al. |
| 2002/0079837 | A1 | 6/2002 | Okazaki |
| 2006/0065957 | A1* | 3/2006 | Hanya ............... H01L 25/0753 257/676 |
| 2008/0130265 | A1 | 6/2008 | Negley et al. |
| 2009/0039762 | A1 | 2/2009 | Park et al. |
| 2010/0289055 | A1 | 11/2010 | Tan et al. |
| 2012/0161180 | A1 | 6/2012 | Komatsu et al. |
| 2012/0280262 | A1 | 11/2012 | Lin |
| 2012/0319563 | A1 | 12/2012 | Ishihara et al. |
| 2013/0200413 | A1 | 8/2013 | Kashiwagi et al. |
| 2014/0226345 | A1 | 8/2014 | Song et al. |
| 2015/0115294 | A2 | 4/2015 | Igarashi et al. |
| 2015/0274938 | A1 | 10/2015 | Okawa et al. |
| 2017/0200867 | A1 | 7/2017 | Chien et al. |
| 2018/0259137 | A1* | 9/2018 | Lee .................. F21S 10/02 |

FOREIGN PATENT DOCUMENTS

| | | |
|---|---|---|
| JP | 2018-014480 | 1/2018 |
| KR | 101468696 | 12/2014 |
| WO | 2018/108734 | 6/2018 |

\* cited by examiner

LIGHT EMITTING DEVICE

CROSS-REFERENCE TO RELATED APPLICATIONS

This application is a continuation of U.S. application Ser. No. 16/276,980, filed Feb. 15, 2019, the contents of which are incorporated herein by reference.

FIELD OF INVENTION

The invention relates to a light emitting device (LED), especially a LED at least partly embedded in transparent or translucent silicone fill, whereby the embedded LED is housed in a white silicone housing. Here and in the following, the wording transparent silicone fill always means a transparent or translucent silicone material. The invention further relates to a method for embedding the LED partly in a white silicone housing on the one hand and partly in transparent silicone fill on the other hand. The invention finally relates to the transparent silicone fill.

BACKGROUND

Flexible LED bands are used for an ever-increasing number of lighting applications. In many cases, an optical element is arranged in front of an LED to alter the light emission, such as e.g. a lens, a reflector and/or a collimator and/or light guide to obtain an emitted light beam of desired properties. Bendability or conformability of the LED band allows fitting in a corresponding application as, for example, vehicle light assemblies which are integrated in curvy automobile body frames. Reliability of the flexible LED band is a key feature especially for automotive applications. Such LEDs have to be embedded in a housing, whereby the housing safeguards the LED for mechanical and environmental influences, such as dirt, humidity and temperature, e.g.. Moreover, the housing may increase the light output as it can direct and reflect the emitted light. Moreover, the housing prolongs the life-time of the LED.

US 2017/200867 A1 discloses, for example, a LED package structure including a conductive frame assembly, a reflective housing, an UV LED chip disposed on the conductive frame assembly, and a die-attach adhesive for bonding the UV LED chip to the conductive frame assembly. The reflective housing includes white Silicone Molding Compound (SMC) and filler mixed in the SMC. Due to the shape of the white housing and the concept where the inner part is completely embedded in the transparent Silicone fill light is lost by absorption on the inner part, especially the light travelling around and below the interposer. In addition the heat transport is not optimal seen the fact that the transparent Silicone fill only has one fifth of the thermal conductivity as compared to the white silicone.

US 2010/0289055 A1 discloses a silicone leaded chip carrier (SLCC) package comprising first and second electrically conductive terminals, a polysiloxane and glass fiber structural body comprising a cavity, a LED light source and a polysiloxane encapsulant in the cavity.

US 2012/0161180 A1 discloses a LED package including, a LED chip, a first and a second lead frame and a resin body. The resin body includes a first art and a second part. The first part transmits light emitted by the LED chip and is surrounded by the second part.

US 2012/280262 A1 discloses a semiconductor light emitting device comprising a circuit, a reflector, an LED chip, an encapsulation layer and a luminescent conversion layer. The circuit and the LED chip are covered by the encapsulation layer. The encapsulation layer is enclosed by the reflector.

EP 1 914 809 A1 discloses a cover for an optoelectronic component.

US 2015/0274938 A1 discloses a curable silicone composition, and semiconductor sealing material and an optical semiconductor device using the curable silicone composition.

In the state of the art, the inner part of a LED device comprising the LED package, a possible interposer and inner part wires are put in a preproduced white silicone housing. In a next step, the transparent silicone is filled in the housing, whereby the transparent silicone encloses the LED device comprising the LED package, a possible interposer and a contact device, comprising a lead frame or inner part wires. Due to the shape of the white housing and the concept where the inner part of the LED is completely embedded in the transparent silicone fill, light is lost by absorption on the inner part, especially the light travelling around and below a possible interposer. In addition the heat transport is not optimal seen the fact that the transparent silicone fill only has one fifth of the thermal conductivity as compared to the white silicone.

SUMMARY

It is an object of the present invention to provide a LED device, whereby the inner part of the LED device is at least partly embedded in transparent silicone fill, whereby the at least partly embedded LED device is housed in a white silicone housing, whereby the loss of light is decreased and the heat transport from the LED device is increased.

The invention is defined by the independent claims. The dependent claims define advantageous embodiments.

According to a first aspect a LED device has an inner part. The inner part of the LED device features at least a contact device, and a LED package. The inner part of the LED device is partly embedded in transparent silicone fill, wherein the LED device is housed in a white silicone housing comprising white silicone. The wording made of white silicone defines here and in the following a white or opaque silicone material. At least the contact device of the inner part of the LED device is at least partially embedded in the white silicone.

The contact device may comprise inner part wires or a lead frame.

According to a preferred embodiment of the invention additionally the LED package is partially embedded in the white silicone.

The part of the inner part of the LED device embedded in the white silicone may be the contact device and additionally a part of the LED package. Thereby the part of the LED package embedded in the white silicone may be at least partly the sides of the LED package, whereby the top with the active layer is not embedded in in the white silicone.

According to a preferred embodiment of the invention the inner part of the LED device additionally comprises an interposer, wherein additionally the interposer is at least partially embedded in the white silicone.

According to a preferred embodiment of the invention the LED package is only partly embedded in the transparent silicone fill.

According to another preferred embodiment of the invention the LED package is completely embedded in the transparent silicone fill.

According to a preferred embodiment of the invention the LED package is completely embedded and the interposer partially embedded in the transparent silicone fill.

According to a preferred embodiment of the invention the inner part of the LED device may comprise at least the contact device, the LED package and the interposer. The contact device may comprise wires ore a lead frame. The part of the inner part of the LED device embedded in the white silicone may be the contact device and additionally at least a part of the interposer or the interposer and additionally a part of LED package.

The LED device may additionally comprise a diffusor made out of silicone configured to diffuse on the side of the LED device opposite of the contact device. The wording silicone configured to diffuse here and in the following means a silicone configured to diffuse light. The diffusor may be a preprocessed part or is produced by applying silicone configured to diffuse in a separate step after providing the transparent silicone.

According to a further aspect of the invention a method for producing a LED device is provided. The method comprises the steps of encasing the inner part of the LED device at least partially with transparent silicone fill, whereby at least the contact device is left open from encasing with transparent silicone fill, and clasping the white silicone partially around the transparent silicone fill, whereby the side of the LED device opposite of the contact device is left open.

Between the steps of encasing the inner part of the LED device at least partially with transparent silicone fill and molding the white silicone partially around the transparent silicone fill, a diffusor made out of silicone configured to diffuse may be applied on the side of the LED device opposite of the contact device. However, the diffusor made out of silicone configured to diffuse may be applied on the side of the LED device opposite of the contact device after the step of molding the white silicone partially around the transparent silicone fill.

The LED package may be at least partially left open from encasing the inner part of the LED device partially with transparent silicone fill additionally. Thereby the left open part of the LED package is at least the side of the LED package opposite of the contact device.

In case the LED device additionally comprises an interposer, in the step of encasing the inner part of the LED device at least partially with transparent silicone fill, additionally the interposer may be at least partially left open from encasing the inner part of the LED device partially with transparent silicone fill.

The step of clasping the white silicone around the transparent silicone fill may be done by overmolding the white silicone over the transparent silicone fill.

In other words, the invention proposes not to use a preprocessed, i.e. for example an extruded, white box but to first encase the inner part of the LED device at least partially with transparent silicone fill and afterwards clasp the white silicone partially around the transparent silicone fill. This allows to partially or completely embed the inner part wires, the interposer sides and even the LED package sides within the white silicone. The white silicone in its fluid state is prevented to cover transparent and diffuse silicone parts, as the silicone of the LED package, i.e. the light emitting area, the silicone fill and the diffusor.

According to a further aspect an alternative method for producing a LED device is provided. The method comprises the steps of producing a housing out of white silicone, whereby the housing has a cavity. The housing may be produced for instance by extrusion.

Afterwards, additional white silicone is filled in in the cavity. This may be done by dispensing the white silicone. The additionally filled in white silicone may be a different one as that the housing is produced of. In an alternative embodiment, the additionally filled in white silicone may be the same material as that the housing is produced of. By filling in the additional white silicone in the cavity of the housing, the cavity is filled only partially. Afterwards, the inner part of the LED device is placed in the cavity in that a part of the inner part of the LED device is encased by the additional filled in white silicone. Thereby, the amount of the additional white silicone filled in the cavity is that much that additionally to the contact device of the inner part of the LED device the interposer is at least partially encased in the additional filled in white silicone.

Afterwards, the transparent silicone fill is filled in.

Between the steps of placing the inner part of the LED device in the cavity and the filling in the transparent silicone fill, a step of curing of the additional filled in white silicone may be made. In another embodiment of the invention the step of curing the additional filled in white silicone may be made in parallel with the curing of the transparent silicone fill at the end of the process.

A diffusor may be placed on the top of transparent silicone fill.

The transparent silicone fill may be cured at this stage.

In the method, the amount of the additional white silicone filled in the cavity is that much that the contact device of the inner part of the LED device is at least partially encased in the additional filled in the white silicone.

In this step, the amount of the additional white silicone filled in the cavity may be that much that additionally to the contact device of the inner part of the LED device the interposer is at least partially encased in the additional filled in white silicone.

However, in this step the amount of the additional white silicone filled in the cavity may be that much that additionally to the contact device of the inner part of the LED device and the interposer, the LED package is partially encased in the additional filled in white silicone as well.

The result of the method according to the invention is a LED device, whereby the inner part of the LED device is at least partly embedded in transparent silicone fill, wherein the at least partly embedded LED device is housed in a white silicone housing comprising white silicone, wherein a part of the inner part of the LED device is embedded in the box made of white silicone, wherein the method is easily realizable and does not need costly production facilities. The method allows production of a LED device with partially or completely embedded inner part wires, the interposer sides and even the LED package sides within the white silicone. The white silicone in its fluid state is prevented to cover transparent and diffuse silicone parts, as the silicone of the LED package, i.e. the light emitting area, the silicone fill and the diffusor. In putting parts of the inner part of the LED device in the white silicone prevents the loss of light emitted by the LED package by absorption on the inner part of the LED device. The light does not reach these parts of the LED device since these parts are enclosed in reflecting the white silicone. Moreover, heat transport from the LED package to the environment is optimized since the white silicone has a thermal conductivity that is five times as big as that of the transparent silicone. Furthermore, the amount of air trapped below the inner part of the LED device is minimized.

The transparent silicone fill may be an optical grade silicone which preferably has a refractive index in the range of 1.38 to 1.65 according test method $nD^{25}$.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a LED device having an LED package, an interposer and a contact device embedded in transparent silicone fill in a housing of white silicone as it is known in the state of the art.

FIG. 2 shows a principal sketch of a LED device having an LED package, an interposer and a contact device embedded partially in transparent silicone fill after a first step of the method according to the invention.

FIG. 3 shows a principal sketch of a LED device having an LED package, an interposer, a contact device and a diffusor embedded partially in transparent silicone fill after a second step of the method according to an embodiment of the invention.

FIG. 4 shows a principal sketch of a LED device having an LED package, an interposer, a contact device and a diffusor embedded partially in transparent silicone fill and encased with white silicone after a third step of the method according to an embodiment of the invention.

FIG. 5 shows a principal sketch of a LED device having an LED package, an interposer, a contact device and a diffusor embedded partially in transparent silicone fill and encased with white silicone after a third step of the method according to a further embodiment of the invention.

FIG. 6 shows a principal sketch of a LED device having an LED package, an interposer, a contact device and a diffusor embedded partially in transparent silicone fill and encased with white silicone after a third step of the method according to a further embodiment of the invention.

FIG. 7 shows a principal sketch of a housing of white silicone according to the alternative method.

FIG. 8 shows a principal sketch of the housing of white silicone with additionally filled in white silicone according to the alternative method.

FIG. 9 shows a principal sketch of a LED device having an LED package, an interposer, a contact device embedded partially in the additionally filled in with white silicone, according to the alternative method.

FIG. 10 shows a principal sketch of a LED device having an LED package, an interposer, a contact device and a diffusor embedded partially in the additionally filled in with white silicone with transparent silicone fill filled in the cavity according to the alternative method.

FIG. 11 shows a principal sketch of a LED device having an LED package, an interposer, a contact device and a diffusor embedded partially in the additionally filled in with white silicone with transparent silicone fill filled in the cavity with a diffusor attached to the transparent silicone fill, according to the alternative method.

In the Figures, like numbers refer to like objects throughout. Objects in the FIGS. are not necessarily drawn to scale.

DETAILED DESCRIPTION OF THE PREFERRED EMBODIMENTS

Various embodiments of the invention will now be described by means of the Figures.

Figure 1:
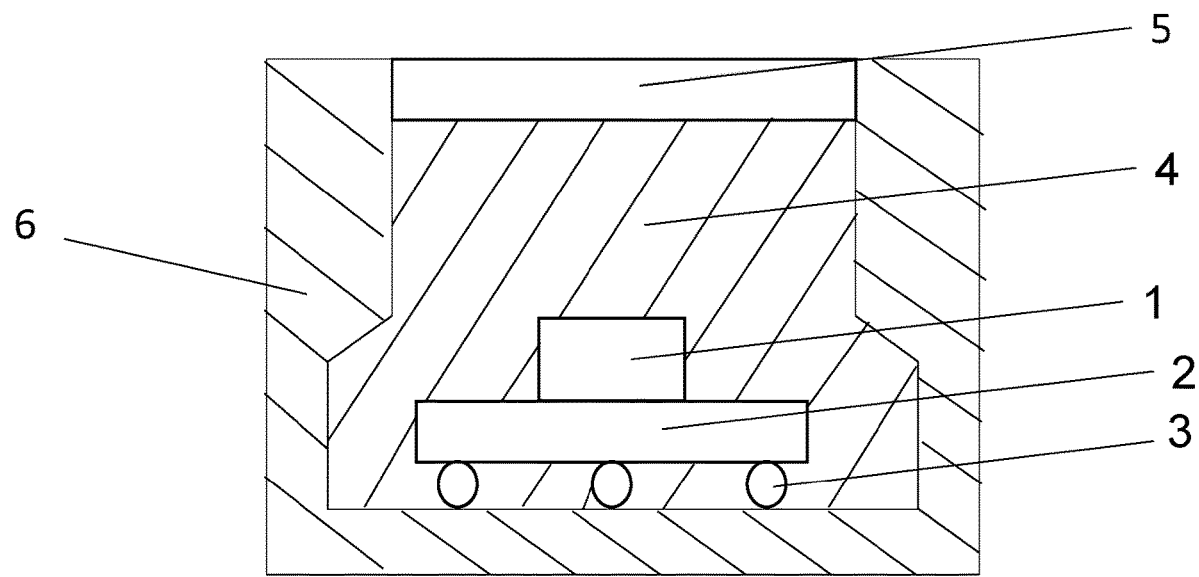

FIG. 1 shows a principal sketch of a LED device having an LED package 1, an interposer 2 and a contact device 3 embedded in transparent silicone fill 4 in a housing 6 of white silicone as it is known in the state of the art. This LED device is produced by starting with the housing, which is made for instance by extrusion. In this housing 6 the inner part of a LED device comprising the LED package 1, the interposer 2 and the contact device 3 comprising inner part wires are put in. In a next step, the transparent silicone is filled in the housing 6, whereby the transparent silicone encloses the inner part of the LED device comprising the LED package 1, the possible interposer 2 and a contact device 3 comprising inner part wires. In service, parts of emitted light is lost by absorption on the inner part, especially the light travelling around and below the interposer 2. In addition the heat transport from the LED package is not optimal seen the fact that the transparent silicone fill 4 only has one fifth of the thermal conductivity as compared to the white silicone.

Figure 2:
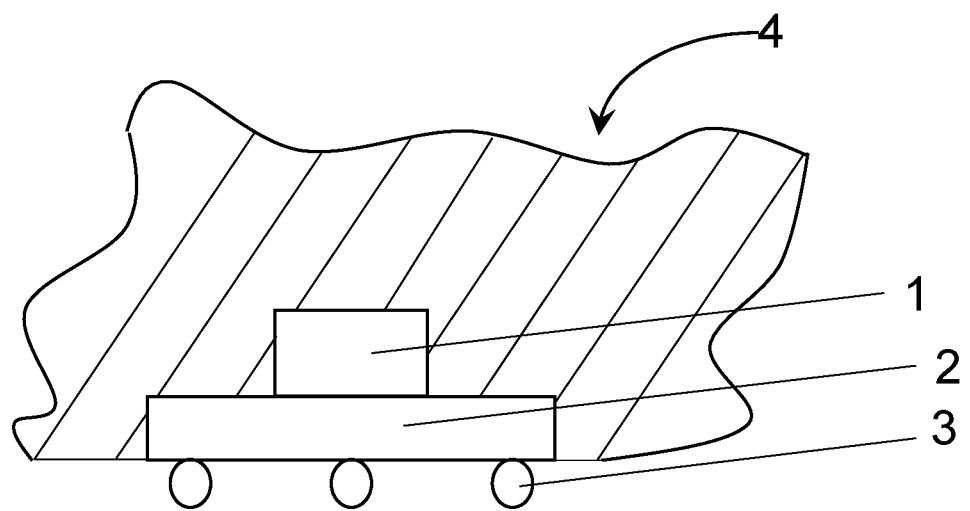
Figure 3:
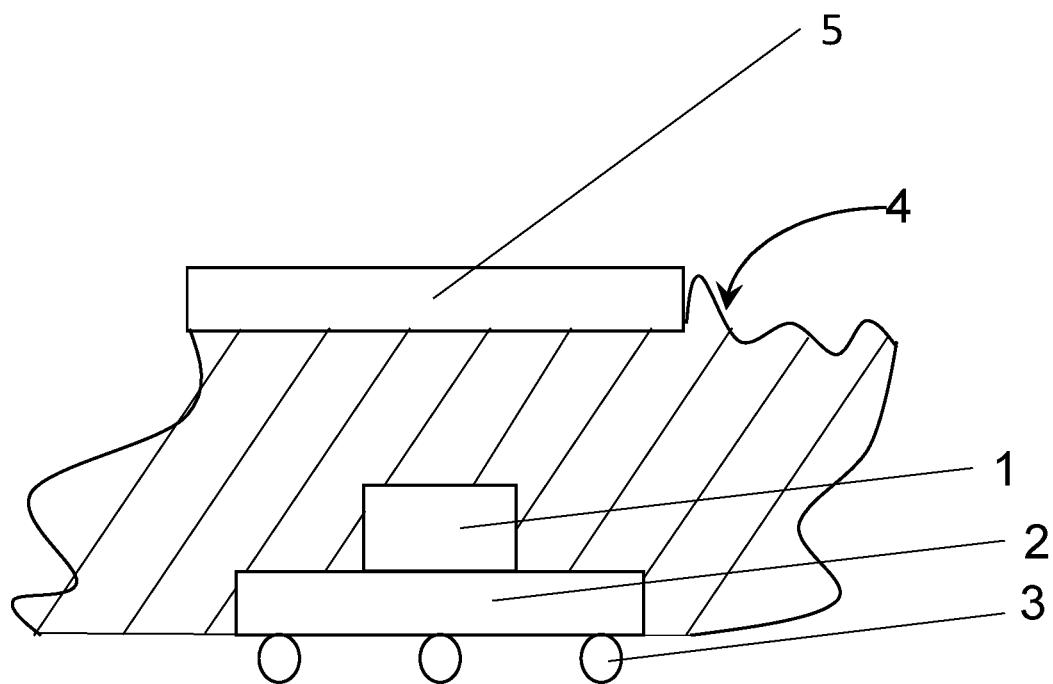

FIG. 2 shows a principal sketch of a LED device having an LED package 1, an interposer 2 and a contact device 3 embedded partially in transparent silicone fill 4 after a first step of the method according to the invention. In this first step, the inner part of the LED device is encased at least partially with transparent silicone fill 4. In the embodiment shown, the LED package and the interposer 2 are encased in the transparent silicone fill 4. The contact device 3 is left open from the transparent silicone fill 4. The outer edges of the transparent silicone fill thereby are to be defined by the housing applied in a further step. Therefore in the figure, the outer edges are cut off. The transparent silicone fill 4 may be applied by any known method, such as for instance transfer molding or injection molding, FIG. 3 shows a principal sketch of a LED device having an LED package 1, an interposer 2, a contact device 3 and a diffusor 5 embedded partially in transparent silicone fill 4 after a second step of the method according to an embodiment of the invention. In this second step, the diffusor 5 is applied to the transparent silicone fill 4. The outer edges of the transparent silicone fill thereby are to be defined by the housing applied in a further step. Therefore in the figure, the outer edges are cut off. The diffusor 5 may be preprocessed and applied to the transparent silicone fill 4. In other embodiments, the diffusor 5 may be applied to the silicone fill by known silicone processing methods such as transfer molding or injections molding, e.g.. The step also may be omitted in case, no diffusor 5 is used with the LED device. Moreover, the step of applying the diffusor 5 may also be done after the step described in FIG. 4.

Figure 4:
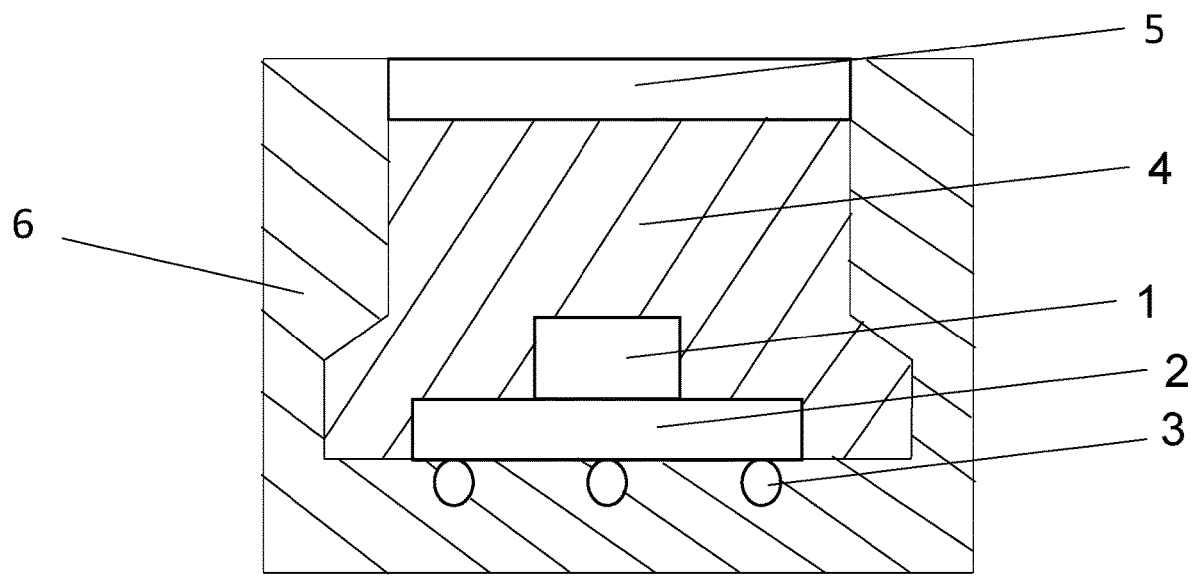

FIG. 4 shows a principal sketch of a LED device having an LED package 1, an interposer 2, a contact device 3 and a diffusor 5 embedded partially in transparent silicone fill 4 and encased with white silicone after a third step of the method according to an embodiment of the invention. Since the contact device 3 was left open from the transparent silicone fill 4, in the third step this contact device is encased in the white silicone of the housing 6. The white silicone forming the housing 6 may be applied by injection molding, i.e. by overmolding the transparent silicone fill, e.g. the top of the LED device, i.e. the side of the LED device opposite the contact device 3, is left open from overmolding with the white silicone. That is to say that the light emitted from the LED package 1 may run through the diffusor 5 and leave the LED device. As already explained in accordance to FIG. 3, in another embodiment the LED device has no diffusor 5. In this case the light emitted by the LED package 1 may leave the LED device via the top side of the LED device, i.e. the transparent silicone fill 4. Moreover, the step of applying the diffusor 5 may also be done after applying the white silicone. In this case the white silicone may only be applied until the top of the transparent silicone fill 4 or beyond the top of the transparent silicone fill when a gap is left in which the diffusor 5 may be applied afterwards.

Figure 5:
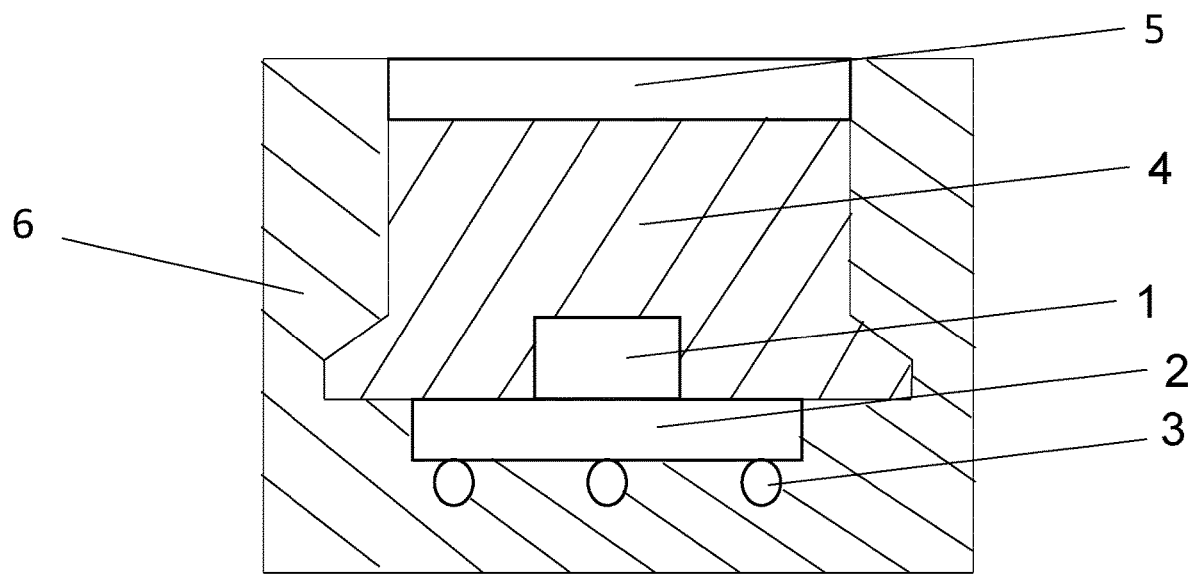

FIG. 5 shows a principal sketch of a LED device having an LED package 1, an interposer 2, a contact device 3 and a diffusor 5 embedded partially in transparent silicone fill 4 and encased with white silicone after a third step of the method according to an further embodiment of the invention. In this embodiment, in the step when the transparent silicone fill 4 is applied, additionally to the contact device 3 the interposer 2 is left open from the transparent silicone fill 4 as well. In the step when the white silicone box is applied, the contact device 3 as well as the interposer 2 is clasped with the white silicone. Accordingly, only the LED package 1 is left open from the box made of white silicone.

Figure 6:
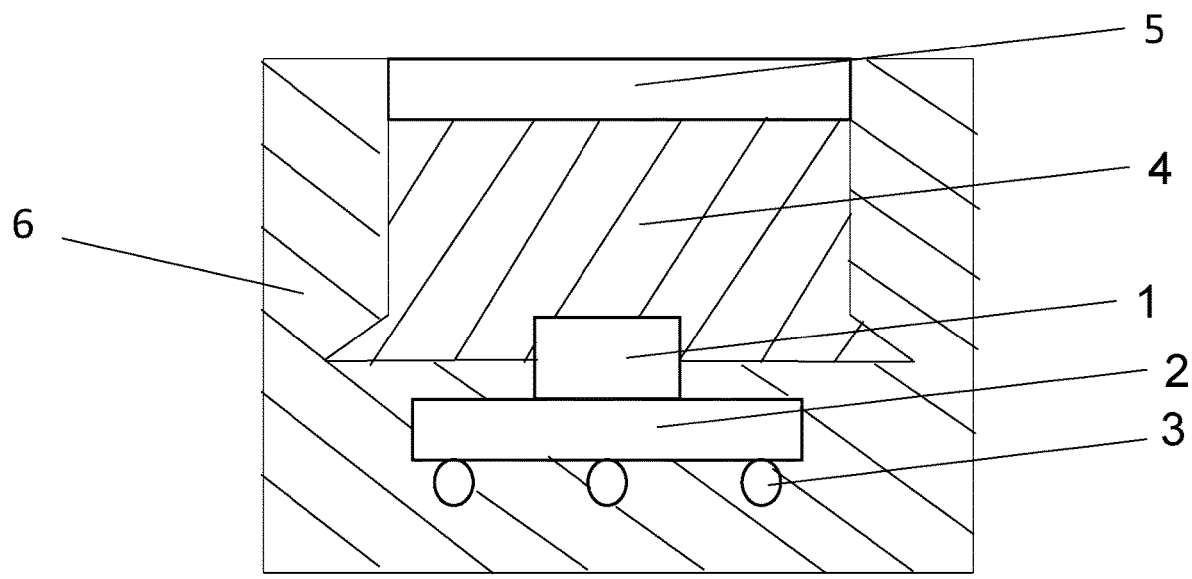

FIG. 6 shows a principal sketch of a LED device having an LED package 1, an interposer 2, a contact device 3 and a diffusor 5 embedded partially in transparent silicone fill 4 and encased with white silicone after a third step of the method according to an further embodiment of the invention. In this embodiment, in the step when the transparent silicone fill 4 is applied, additionally to the contact device 3 and the interposer 2, the LED package 1 is partly left open from the transparent silicone fill 4. In the step when the white silicone box is applied, the contact device 3, the interposer 2 and a part of the LED package 1 is clasped with the white silicone. Accordingly, only a part the LED package 1 is left open from the white silicone, especially the top, i.e. the side opposite of the contact device 3, of the LED package 1 is left open from the white silicone. Light emitted by the LED package 1 may leave the LED device.

Figure 7:
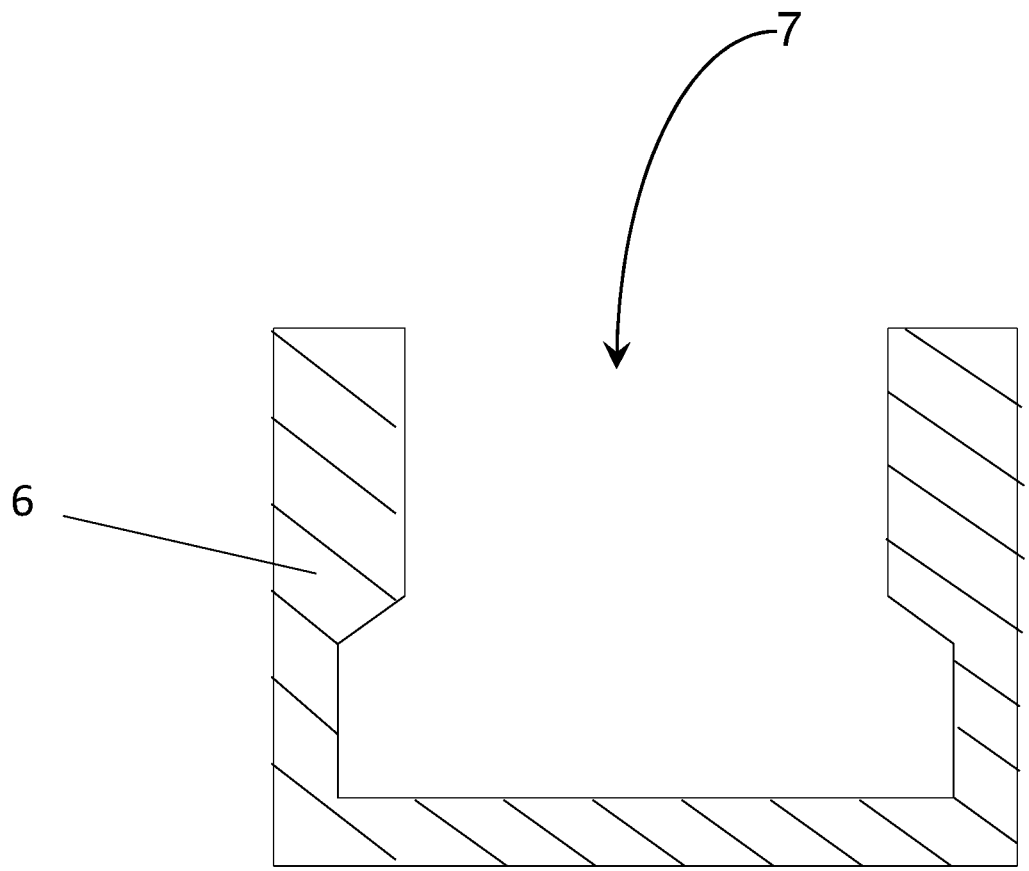

FIG. 7 shows a principal sketch of a housing 6 made of white silicone as used in the alternative method. The housing 6 comprises a cavity 7 in which a LED device can be placed. The housing 6 is made of white silicone, which reflects the light. An LED device placed in such housing 6 is able to emit the light through the opening at the top side of the housing 6 only. The housing 6 may be produced for instance by extruding or injection molding, Methods for producing such housings 6 are known by those skilled in the art.

Figure 8:
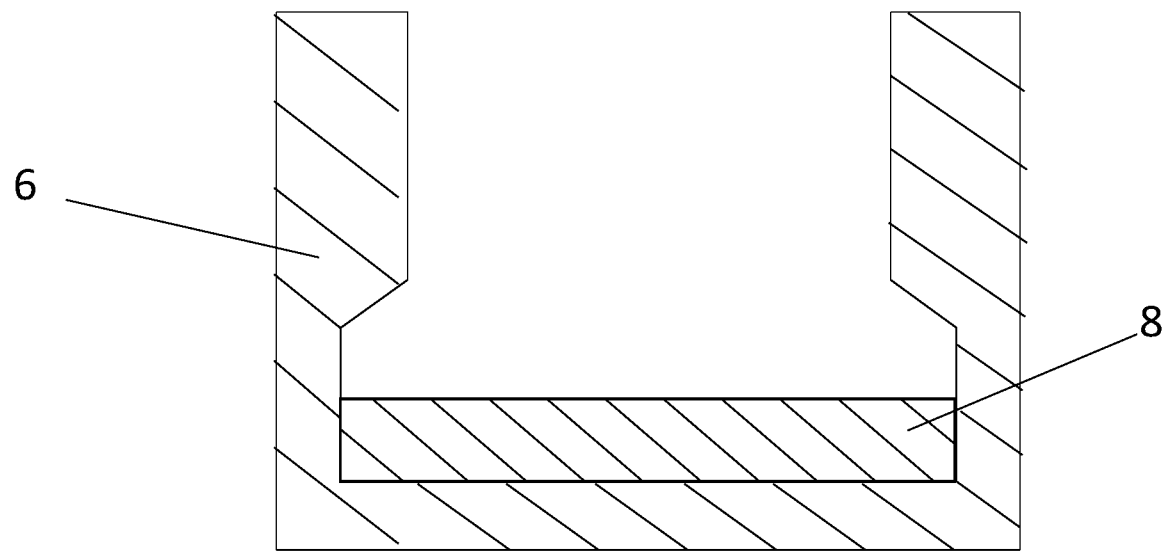

FIG. 8 shows a principal sketch of the housing 6 of white silicone with additionally filled in white silicone 8, according to the alternative method. The additional white silicone 8 fills the cavity only partially. The additionally filled in white silicone 8 may be a different material as the white silicone of the housing 6. In another embodiment, the additionally filled in white silicone 8 may be the same material as the white silicone of the housing 6. Filling in the additional filled in white silicone 8 can be done by dispending the material for instance in its fluid state.

Figure 9:
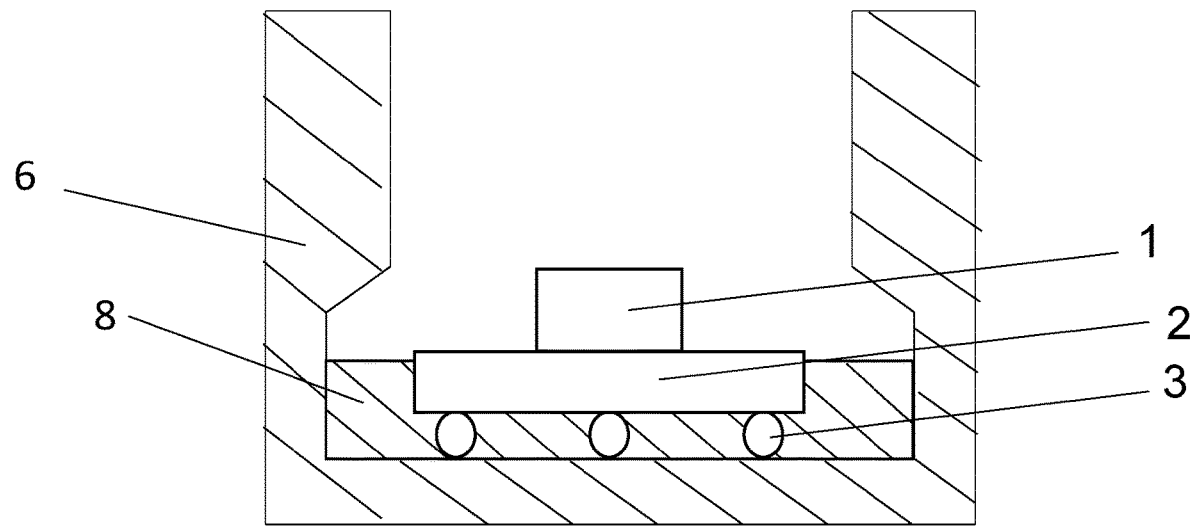

FIG. 9 shows a principal sketch of a LED device having an LED package 1, an interposer 2 and a contact device 3 embedded partially in the additionally filled in with a box of white silicone 8, according to the alternative method. Since the additionally filled in silicone 8 is in fluid state, the inner part of the LED device dives in this material easily. The inner part of the LED device dives in the additionally filled in white silicone 8 until it touches the bottom of the housing 6, which is cured white silicone. Thereby the amount of the additionally filled in with white silicone 8 is calculated in that way that the inner part of the LED device dives in only partially, i.e. only at least partially with the contact device 3 or with the contact device 3 and at least partially the interposer 2 or with the contact device 3, the interposer 2 and partially with the LED package 1. Thereby, the top side of the LED package 1, i.e. the side opposite of the contact device 3, is left out of the additionally filled in with white silicone 8. Therewith light emitted from the LED package 1 may leave the LED device at this top side.

Figure 10:
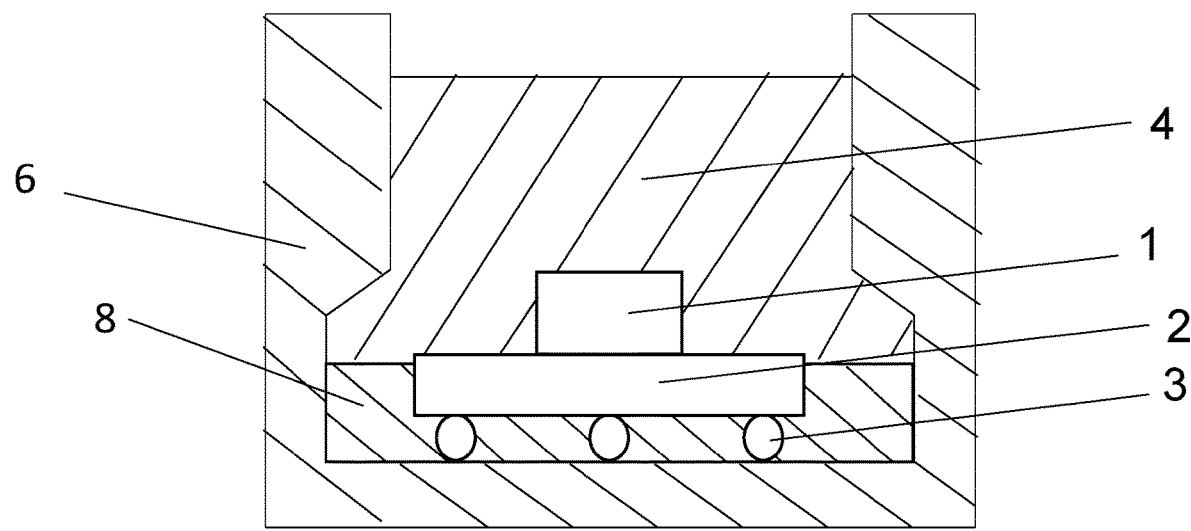

FIG. 10 shows a principal sketch of a LED device having an LED package 1, an interposer 2, a contact device 3 and a diffusor 5 embedded partially in the additionally filled in with white silicone 8 with transparent silicone fill 4 filled in the cavity 8, according to the alternative method. After placing the inner part of the LED device in the additionally filled in with white silicone 8 in the cavity 7, the additionally filled in with white silicone 8 may be cured. In another embodiment, the additionally filled in with white silicone 8 is not cured at this stage. It may be cured in parallel with the transparent silicone fill 4 filled in in a later step. In any case after placing the inner part of the LED device in the additionally filled in with white silicone 8 in the cavity 7, the cavity 7 is filled with transparent silicone fill 4. Thereby the cavity 7 may be filled totally or only in a rate that a diffusor 5 may be placed on top of the transparent silicone fill 4. Thereby the diffusor 5 can be placed on top of the transparent silicone fill 4 in that way that it is at least partly enclosed from the housing 6.

Figure 11:
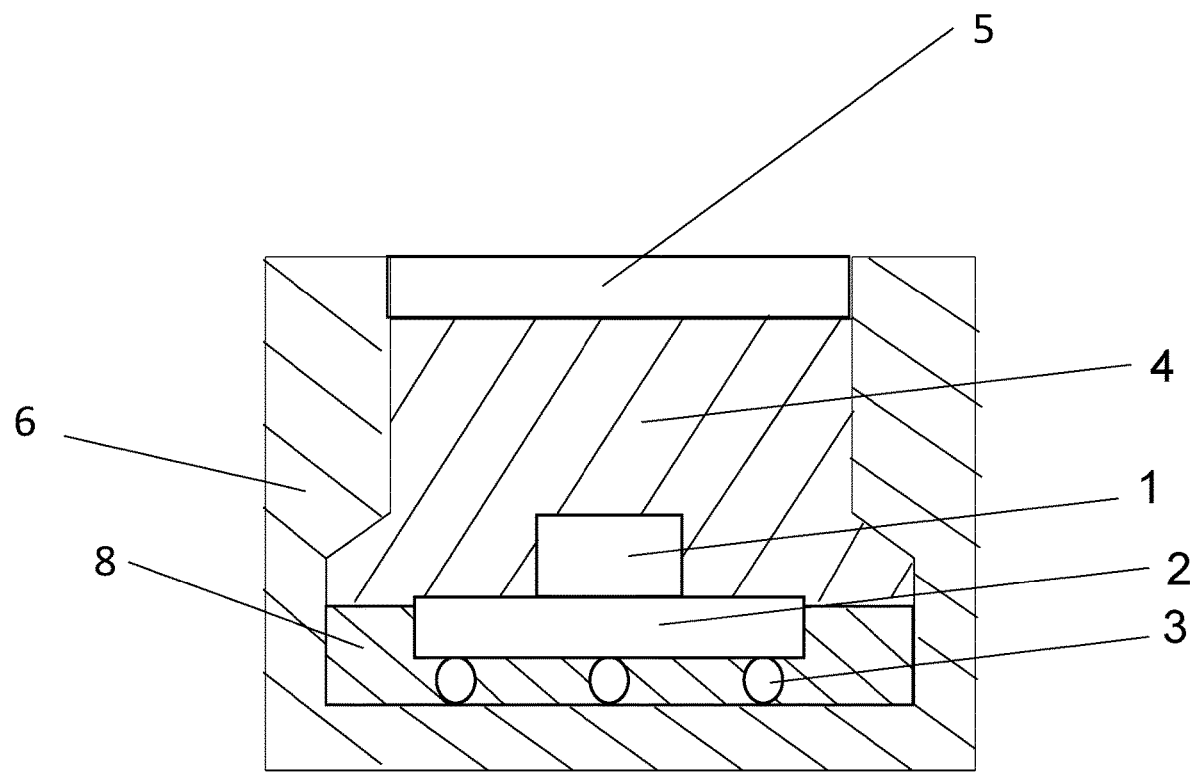

FIG. 11 shows a principal sketch of a LED device having an LED package 1, an interposer 2, a contact device 3 and a diffusor 5 embedded partially in the additionally filled in with white silicone with transparent silicone fill 4 filled in the cavity 7 with a diffusor 5 attached to the transparent silicone fill 4, according to the alternative method. The diffusor 5 is attached to the top side of the transparent silicone fill 4 in that way that its small sides are enclosed from the housing 6 and the top side is open to the environment. Accordingly, only a part the LED package 1 is left open from the white silicone, especially the top, i.e. the side opposite of the contact device 3, of the LED package 1 is left open from the white silicone. Light emitted by the LED package 1 may leave the LED device through this area. In putting parts of the inner part of the LED device in the white silicone prevent the lost of light emitted by the LED package 1 by absorption on the inner part of the LED device. The light does not reach these parts of the LED device since these parts are enclosed in reflecting the white silicone. Moreover, heat transport from the LED package 1 to the environment is optimized since the white silicone has a thermal conductivity which is five times as big as that of the transparent silicone 4.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

REFERENCE SIGNS

1 LED package
2 Interposer
3 Contact device
4 Silicone fill
5 Diffusor
6 Housing
7 Cavity
8 Additional filled in white silicone

What is claimed is:

1. A light emitting diode (LED) device comprising:
an inner part of the LED device, the inner part including at least a contact device and an LED chip, the contact device at least partly embedded in a housing, such that the contact device is-at least partially embedded in a white silicone.

2. The LED device of claim 1, further comprising a transparent silicone fill at least partially embedding the LED chip.

3. The LED device of claim 1, the inner part of the LED device further comprising an interposer at least partially embedded in the white silicone.

4. The LED device of claim 3, further comprising a transparent silicone fill at least partially embedding the interposer.

5. The LED device of claim 1, further comprising a transparent silicone fill at least partially embedding the contact device.

6. The LED device of claim 4, further comprising a diffuser adjacent to the transparent silicone fill.

* * * * *